United States Patent
Bansal et al.

(10) Patent No.: US 10,438,860 B2
(45) Date of Patent: Oct. 8, 2019

(54) DYNAMIC WAFER LEVELING/TILTING/SWIVELING STEPS FOR USE DURING A CHEMICAL VAPOR DEPOSITION PROCESS

(71) Applicant: Applied Materials, Inc., Santa Clara, CA (US)

(72) Inventors: Amit Kumar Bansal, Milpitas, CA (US); Juan Carlos Rocha, San Carlos, CA (US); Karthik Janakiraman, San Jose, CA (US); Tuan Anh Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 396 days.

(21) Appl. No.: 15/136,611

(22) Filed: Apr. 22, 2016

(65) Prior Publication Data

US 2017/0309528 A1    Oct. 26, 2017

(51) Int. Cl.
*C23C 16/458* (2006.01)
*H01L 21/66* (2006.01)
(Continued)

(52) U.S. Cl.
CPC .......... *H01L 22/26* (2013.01); *C23C 16/4583* (2013.01); *C23C 16/45565* (2013.01);
(Continued)

(58) Field of Classification Search
CPC .............. C23C 16/458; C23C 16/4582; C23C 16/4583; C23C 14/54; C23C 16/52
See application file for complete search history.

(56) References Cited

U.S. PATENT DOCUMENTS 5,399,387 A * 3/1995 Law ................ C03C 17/225
427/166
6,444,277 B1 * 9/2002 Law .................. C23C 16/0245
257/E21.101
(Continued)

FOREIGN PATENT DOCUMENTS

TW            538491 B    6/2003
TW        200943470 A   10/2009

OTHER PUBLICATIONS

Sundara Venkatesh, P., et al., "Investigations on the growth of manifold morphologies and optical properties of ZnO nanostructures grown by radio frequency magnetron sputtering". AIP Advances 3 082133 (2013), pp. 1-11.*
(Continued)

*Primary Examiner* — Bret P Chen
(74) *Attorney, Agent, or Firm* — Patterson + Sheridan LLP

(57) ABSTRACT

The implementations described herein generally relate to steps for the dynamic, real-time control of the process spacing between a substrate support and a gas distribution medium during a deposition process. Multiple dimensional degrees of freedom are utilized to change the angle and spacing of a substrate plane with respect to the gas distributing medium at any time during the deposition process. As such, the substrate and/or substrate support may be leveled, tilted, swiveled, wobbled, and/or moved during the deposition process to achieve improved film uniformity. Furthermore, the independent tuning of each layer may be had due to continuous variations in the leveling of the substrate plane with respect to the showerhead to average effective deposition on the substrate, thus improving overall stack deposition performance.

20 Claims, 5 Drawing Sheets

(51) Int. Cl.
  *H01L 21/02*     (2006.01)
  *H01L 21/285*    (2006.01)
  *H01L 21/687*    (2006.01)
  *C23C 16/455*    (2006.01)
  *C23C 16/52*     (2006.01)
  *H01L 21/67*     (2006.01)

(52) U.S. Cl.
  CPC ........ *C23C 16/45589* (2013.01); *C23C 16/52* (2013.01); *H01L 21/0262* (2013.01); *H01L 21/02271* (2013.01); *H01L 21/28556* (2013.01); *H01L 21/67253* (2013.01); *H01L 21/68742* (2013.01); *H01L 21/68764* (2013.01); *H01L 21/68785* (2013.01); *H01L 22/12* (2013.01)

(56) References Cited

U.S. PATENT DOCUMENTS

| | | | |
|---|---|---|---|
| 8,685,759 | B2 | 4/2014 | Wang et al. |
| 2002/0142493 | A1 | 10/2002 | Halliyal et al. |
| 2002/0174832 | A1 | 11/2002 | Baldwin et al. |
| 2005/0006556 | A1* | 1/2005 | Floyd .................. C23C 16/455 248/566 |
| 2005/0032459 | A1* | 2/2005 | Surana ................. B24B 37/16 451/5 |
| 2005/0056217 | A1* | 3/2005 | Yamada .............. C23C 16/4411 118/715 |
| 2005/0199182 | A1* | 9/2005 | Masuda ................ C23C 16/409 118/715 |
| 2007/0232065 | A1 | 10/2007 | Basol |
| 2008/0286444 | A1 | 11/2008 | Floyd et al. |
| 2009/0218317 | A1* | 9/2009 | Belen ................. C23C 16/45565 216/67 |
| 2010/0294199 | A1 | 11/2010 | Tran et al. |
| 2011/0070370 | A1* | 3/2011 | Teo ....................... C23C 16/452 427/255.28 |
| 2013/0156940 | A1 | 6/2013 | Wu et al. |
| 2013/0270362 | A1* | 10/2013 | Sferlazzo .......... C23C 16/45565 239/225.1 |
| 2017/0191160 | A1* | 7/2017 | Wiltse ................ C23C 16/45565 |

OTHER PUBLICATIONS

Iriarte, G.F., et al., "Effect of substrate-target distance and sputtering pressure in the synthesis of AlN thin films". pp. 1-6. No citation or date available.*

International Search Report and Written Opinion in related application PCT/US2017/023636 dated Jul. 4, 2017.

* cited by examiner

DYNAMIC WAFER LEVELING/TILTING/SWIVELING STEPS FOR USE DURING A CHEMICAL VAPOR DEPOSITION PROCESS

BACKGROUND

Field

Implementations of the present disclosure generally relate to semiconductor manufacturing and, more particularly, to methods and apparatus for achieving a desired thickness uniformity of a layer formed on a substrate during a deposition process.

Description of the Related Art

The fabrication of semiconductor devices involves the formation of a thin film on a semiconductor substrate by a chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of energy, such as radio frequency (RF) energy, to the reaction zone proximate the substrate surface thus creating a plasma of highly reactive species. The high reactivity of the released species reduces the energy needed for a chemical reaction to take place, and thus lowers the temperature for such CVD processes.

The substrate rests on a substrate support during processing in the chamber, such as during the formation of a layer on the substrate. The substrate support typically is a substrate heater which supports and heats the substrate during substrate processing. The substrate rests above the heater surface of the heater and heat is supplied to the bottom of the substrate. Some substrate heaters are resistively heated, for example, by electrical heating such as resistive coils disposed below the heater surface or embedded in a plate on or in the heater surface. The heat from the substrate heater is the primary source of energy in thermally driven processes such as thermal CVD for depositing layers including undoped silicate glass (USG) layers, doped silicate glass layers, and the like.

The substrate support typically supports the substrate opposite the gas distribution medium through which a reactant gas is supplied to the chamber. The gas distribution medium is often part of a gas distribution assembly for supplying one or more gases to the chamber. The gas distribution assembly may be in the form of a flat surface showerhead, a faceplate, a profiled showerhead, a series of nozzles, or any form that is fixed at one position. The gas flow from the gas distribution medium to the substrate affects the uniformity of the layer formed on the substrate, such as the thickness of the layer. Furthermore, the substrate support is sensitive to the process spacing between the substrate plane and the position at which chemical vapor is distributed.

The positioning and/or movement of the substrate support is typically performed to adjust the position of the substrate in preparation for processing. Once the desired positioned has been achieved, the position is typically maintained to ensure that the substrate does not move during the deposition process. However, deposition non-uniformities still exist even with restricted movement of the substrate during deposition.

Therefore, what is needed in the art is a method and system for enabling the dynamic, real-time control of the process spacing between the gas distribution member and the substrate support which enables multi-dimensional degrees of freedom to change the angle and spacing of the substrate plane with respect to the gas distribution medium during deposition.

SUMMARY

The implementations described herein generally relate to the dynamic, real-time control of the process spacing between a substrate support and a gas distribution medium during a deposition process. Multiple dimensional degrees of freedom are utilized to change the angle and spacing of the substrate plane with respect to the gas distributing medium at any time during the deposition process. As such, the substrate and/or substrate support may be leveled, tilted, swiveled, wobbled, and/or moved during the deposition process to achieve improved film uniformity. Furthermore, the independent tuning of each layer may be had due to continuous variations in the leveling of the substrate plane with respect to the showerhead to average effective deposition on the substrate, thus improving overall stack deposition performance.

In one embodiment, a method of controlling processing spacing between a gas distribution medium and a substrate support disposed opposite the gas distribution medium is disclosed. The method includes (a) depositing a layer on a substrate disposed on the substrate support, (b) measuring a thickness of the layer on the substrate, and (c) calculating differences in thickness between a reference location on the substrate and a plurality of remaining locations on the substrate. The method further includes (d) determining processing spacing adjustment amounts for the plurality of remaining locations relative to the reference location based on the differences in thickness between the reference location and the plurality of remaining locations, and (e) dynamically adjusting the processing spacing in real time to reduce the differences in thickness between the reference location and each of the plurality of remaining locations. The dynamic adjusting occurs during the depositing.

In another embodiment, a method of controlling processing spacing between a gas distribution medium and a substrate support disposed opposite the gas distribution medium is disclosed. The method includes adjusting the substrate support at a first mounting location coupled to the substrate support, and adjusting the substrate support at a second mounting location coupled to the substrate support. The adjusting of the substrate support at the first mounting location and at the second mounting location occurs during a chemical vapor deposition process and in real time to reduce a difference in deposition non-uniformities.

In yet another embodiment, a method of controlling processing spacing between a gas distribution medium and a substrate support disposed opposite the gas distribution medium is disclosed. The method includes (a) depositing a layer on a substrate disposed on the substrate support, (b) measuring a thickness of the layer on the substrate, and (c) calculating differences in thickness between a reference location on the substrate and a plurality of remaining locations on the substrate. The method also includes (d) determining processing spacing adjustment amounts for the plurality of remaining locations relative to the reference location based on the differences in thickness between the reference location and the plurality of remaining locations, and (e) dynamically adjusting the substrate support in real time at a first mounting location coupled to the substrate support to reduce the differences in thickness between the reference location and each of the plurality of remaining locations. The method also includes (f) dynamically adjusting the substrate support in real time at a second mounting location coupled to the substrate support to reduce the differences in thickness between the reference location and each of the plurality of remaining locations, wherein each dynamic adjusting occurs during the depositing.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
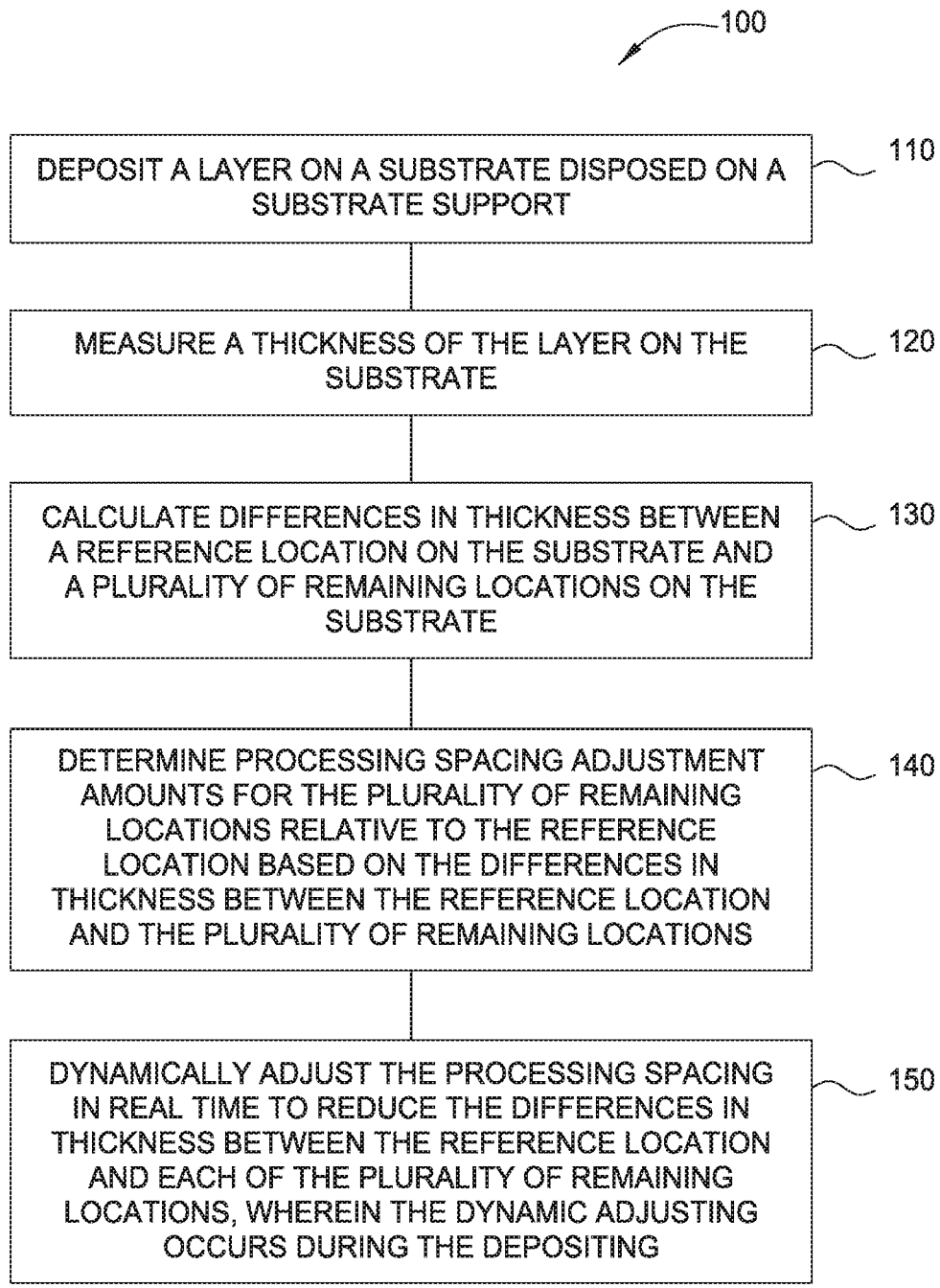
FIG. 1 schematically illustrates operations of a method for controlling processing spacing during a deposition process, according to one implementation described herein.

To facilitate understanding, identical reference numerals have been used, where possible, to designate identical elements that are common to the figures. It is contemplated that elements and features of one embodiment may be beneficially incorporated in other implementations without further recitation.

DETAILED DESCRIPTION

The implementations described herein generally relate to the dynamic, real-time control of the process spacing between a substrate support and a gas distribution medium during a deposition process. Multiple dimensional degrees of freedom are utilized to change the angle and spacing of the substrate plane with respect to the gas distributing medium at any time during the deposition process. As such, the substrate and/or substrate support may be leveled, tilted, swiveled, wobbled, and/or moved during the deposition process to achieve improved film uniformity. Furthermore, the independent tuning of each layer may occur due to continuous variations in the leveling of the substrate plane with respect to the showerhead to average effective deposition on the substrate, thus improving overall stack deposition performance.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The term "substrate" may further include the term "wafer." The substrate itself is not limited to any particular size or shape. Although the implementations described herein are generally made with reference to a round substrate, other shapes, such as polygonal, squared, rectangular, curved, or otherwise non-circular workpieces may be utilized according to the implementations described herein.

FIG. 1 schematically illustrates operations of a method 100 for controlling the processing spacing between a gas distribution member and a substrate support in a processing chamber. In some embodiments, the substrate support is disposed opposite the gas distribution member such that a processing volume exists in the area between the substrate support and the gas distribution member. The processing volume may be a gap disposed between the substrate support plane and the fixed plane of the gas distribution member at which a chemical vapor is distributed. In some embodiments, the gas distribution member may distribute the chemical vapor via a flat surface showerhead, a profiled showerhead, a series of nozzles, or any other form factor of distribution medium that is fixed at one position. The method 100 may be applicable to all Chemical Vapor Deposition (CVD) processes that utilize a substrate support. The method 100 enables the dynamic and real-time control of the processing spacing, and further allows for multiple dimensional degrees of freedom to change the angle and spacing of the substrate plane with respect to the gas distribution member at any time during the deposition process.

The processing chamber may also include a controller. The controller facilitates the control and automation of the method 100. The controller may be coupled to or in communication with one or more of the processing chamber, the substrate support, each measurement location, each measurement device, and/or the gas distribution member. In some embodiments, each measurement device may provide information to the controller regarding substrate processing, film deposition, film uniformity, substrate support movement, among other information.

The controller may include a central processing unit (CPU), memory, and support circuits (or I/O). The CPU may be one of any form of computer processors that are used in industrial settings for controlling various processes and hardware (e.g., pattern generators, motors, and other hardware) and monitor the processes (e.g., processing time and substrate position or location). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include conventional cache, power supplies, clock circuits, input/output circuitry, subsystems, and the like. A program (or computer instructions) readable by the controller implements the method described herein and/or determines which tasks are performable on a substrate or substrate support. The program may be software readable by the controller and may include code to monitor and control, for example, the processing time and substrate position or location of the substrate support within the processing chamber.

At operation 110, a layer is deposited on a substrate disposed on a substrate support. The layer may be a thin film coating formed as the result of a reaction between the various gaseous phases and the heated surface of the substrate within the CVD processing chamber. At operation 120, a thickness of the layer on the substrate is measured. The thickness of the layer may be measured at a plurality of locations on the substrate. The substrate support may include a plurality of measurement locations to measure the spacing between the substrate or substrate support and the gas distribution member. In some implementations, the each measurement location may comprise a measurement device mounted thereon. The number and proximity of the measurement locations may vary.

At operation 130, a difference in thickness between a reference location on the substrate and a plurality of remaining locations on the substrate is calculated. The reference location may be predetermined or selected in real time. Any point may be selected as the reference location and the thickness differences are calculated between the reference location and the remaining locations. The thickness difference between the reference location and each of the remaining locations is divided by the deposition time to obtain the deposition rate differentials between the reference location and the remaining locations.

At operation 140, processing spacing adjustment amounts for the plurality of remaining location relative to the reference location are determined based on the differences in thickness between the reference location and the plurality of remaining locations divided by a deposition time for forming the layer on the substrate. In some implementations, the processing spacing adjustment amounts are improved by multiplying by a deposition time for forming the layer on the substrate, by a correlation factor previously determined to provide improved thickness uniformity for the layer. The correlation factor is proportional to a ratio of the change in spacing divided by a deposition thickness rate of the layer. The change in spacing may be determined by the difference in space between the gas distribution member and the substrate support for each remaining location.

At operation 150, the processing spacing is dynamically adjusted in real time to reduce the differences in thickness between the reference location and each of the plurality of remaining locations. The dynamic adjusting occurs during the depositing. In some implementations the dynamic adjusting may occur at least once during the depositing, while in other implementations the dynamic adjusting may occur multiple times during the depositing. In other implementations, the dynamic adjusting may occur continuously during the depositing. Testing has been performed, and results indicated that the deposition rate of the layer on the substrate can be correlated to the spacing between the substrate and the gas distribution member, and hence the uniformity of the thickness of the layer formed on the substrate can be adjusted by changing the tilt of the substrate support on which the substrate rests during the deposition process.

The dynamic adjusting may include leveling, tilting, swiveling, wobbling, shaking, vibrating, or the like, of the substrate or the substrate support during the deposition process. In some implementations, the dynamic adjusting may include continuously changing a plane of the substrate or the substrate support during deposition. In other implementations, the dynamic adjusting may include continuously changing a plane of each of the plurality of remaining locations. Further, the dynamic adjusting may include altering an angle and/or spacing of a plane of the substrate support with respect to the gas distribution member.

In some implementations, each of operations 110-150 may be repeated until the depositing is complete.

Figure 2:
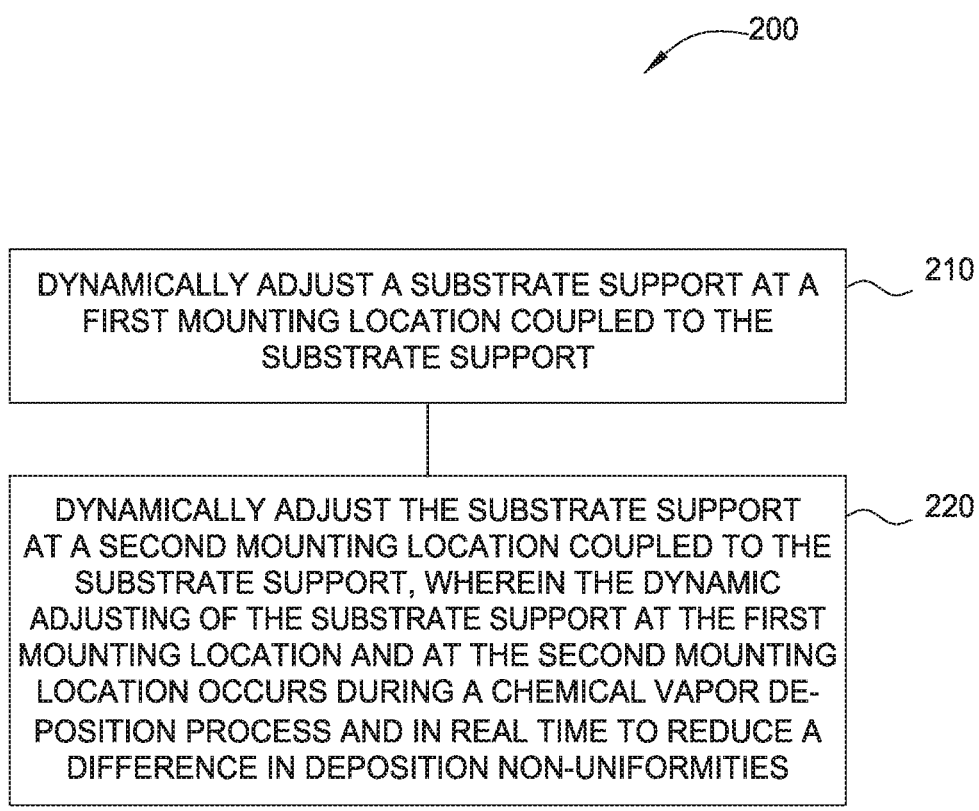
FIG. 2 schematically illustrates operations of a method for controlling processing spacing during a deposition process, according to implementations described herein.

FIG. 2 schematically illustrates operations of a method 200 of controlling processing spacing between a gas distribution member and a substrate support disposed opposite the gas distribution member. The gas distribution member and the substrate support are each disposed in a processing chamber, and in some implementations, the gas distribution member is disposed adjacent the substrate support. In some embodiments, the substrate support is disposed opposite the gas distribution member such that a processing volume exists in the area between the substrate support and the gas distribution member. The gas distribution member, the substrate support, the processing chamber, the gap, and/or processing volume disclosed in relation to the method 200 may be substantially similar to the processing volume disclosed in relation to the method 100, discussed supra. Furthermore, the processing chamber disclosed in relating to the method 200 may also include a controller. The controller facilitates the control and automation of the method 200, and is substantially similar to the controller disclosed in relation to the method 100, discussed supra. The method 200 may be applicable to all Chemical Vapor Deposition (CVD) processes that utilize a substrate support. The method 200 enables the dynamic and real-time control of the processing spacing, and further allows for multiple dimensional degrees of freedom to change the angle and spacing of the substrate plane with respect to the gas distribution member at any time during the deposition process.

At operation 210, the substrate support is dynamically adjusted at a first mounting location coupled to the substrate support. In certain implementations, the substrate support may be coupled to one or more adjustment members. Moreover, in some embodiments, the one or more adjustment members may be coupled to the substrate support at a plurality of mounting locations distributed over the substrate support. The adjustment members are independently adjustable to change the spacing between the substrate support and the gas distribution plate at the mounting locations. As such, an alteration of the spacing between the substrate support and the gas distribution plate at a plurality of corresponding mounting locations, thus adjusting the tilt of the substrate support with respect to the gas distribution member. In some embodiments, the one or more mounting locations may be uniformly distributed around the substrate support with respect to a center of the substrate support. Furthermore, the one or more mounting locations may be disposed on a bottom side of the substrate support. In some implementations, at least three mounting locations may be utilized, each mounting location having an adjustment member operatively coupled thereto.

At operation 220, the substrate support is dynamically adjusted at a second mounting location coupled to the substrate support. The dynamic adjusting of the substrate support at the first mounting location and at the second mounting location occurs during a chemical vapor deposition process, and in real time to reduce a difference in deposition non-uniformities.

Each dynamic adjustment may include one of leveling, tilting, swiveling, or wobbling of the substrate support or the substrate during a deposition process. In certain implementations, the dynamic adjusting of the substrate support at the first mounting location and the dynamic adjusting of the substrate support at the second mounting location occur concurrently, while in other implementations the each may occur at different times, and/or begin at separate times. The method 200 may further include repeating the dynamic adjusting of the substrate support at the first mounting location and at the second mounting location until the chemical vapor deposition process is complete.

Moreover, in certain implementations, the method 200 may further include dynamically adjusting the substrate support at a third mounting location coupled to the substrate support, wherein the dynamic adjusting of the substrate support at the third mounting location occurs during the chemical vapor deposition process and in real time to reduce a difference in deposition non-uniformities. In implementations including the dynamic adjusting of the substrate support at the third mounting location, each of the dynamic adjusting of the substrate support at the first mounting location, the second mounting location, and the third mounting location may occur concurrently, or, in some implementations, each may begin at different, and/or each may occur at separate times.

Figure 3:
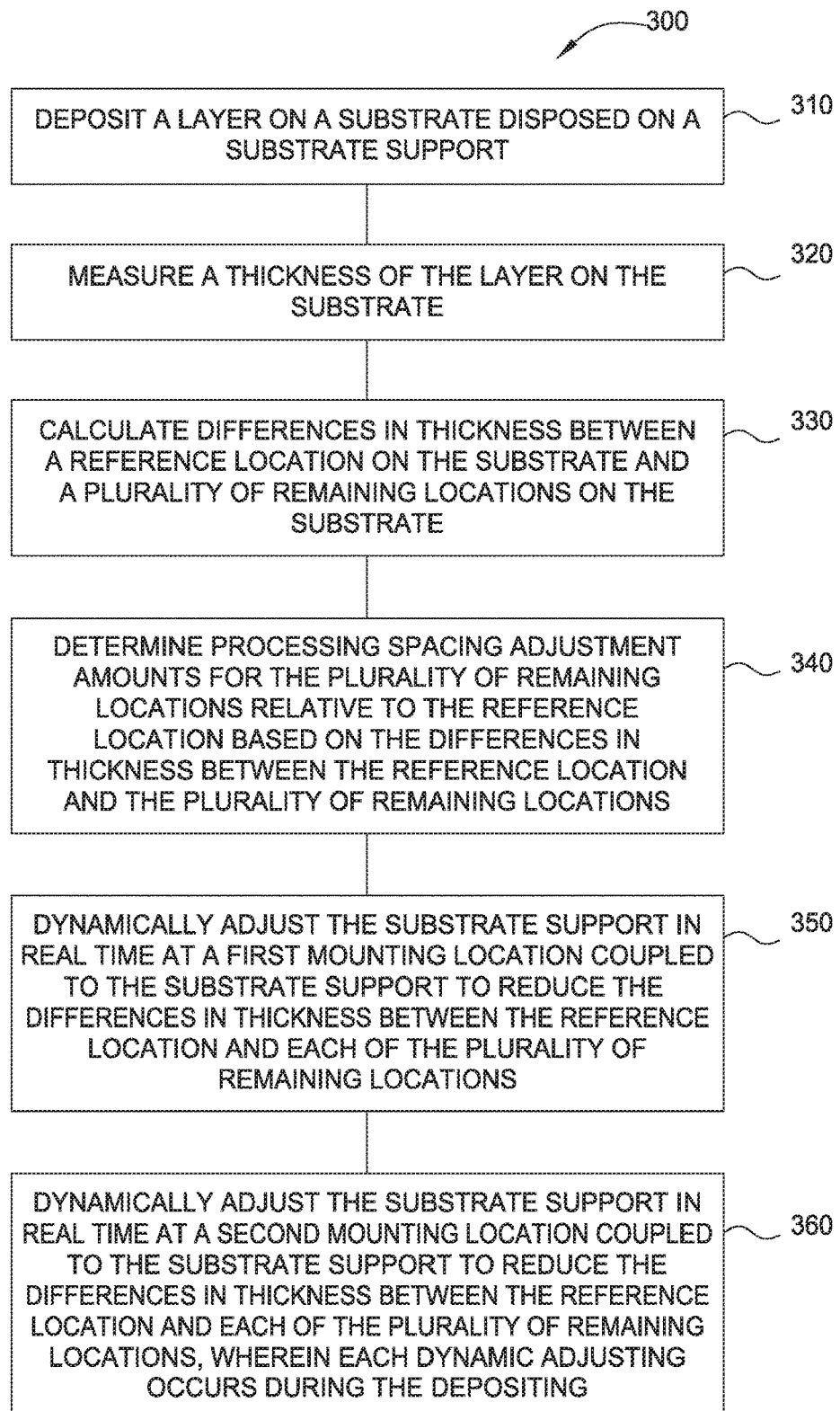
FIG. 3 schematically illustrates operations of a method for controlling processing spacing during a deposition process, according to implementations described herein.

FIG. 3 schematically illustrates operations of a method 300 of controlling processing spacing between a gas distribution member and a substrate support disposed opposite the gas distribution member. The gas distribution member and the substrate support are each disposed in a processing chamber, and in some implementations, the gas distribution member is disposed adjacent the substrate support. In some embodiments, the substrate support is disposed opposite the gas distribution member such that a processing volume exists in the area between the substrate support and the gas distribution member. The gas distribution member, the substrate support, the processing chamber, the gap, and/or processing volume disclosed in relation to the method 300 may be substantially similar to the processing volume disclosed in relation to the method 100 and/or the method 200, discussed supra. Furthermore, the processing chamber disclosed in relating to the method 300 may also include a controller. The controller facilitates the control and automation of the method 300, and is substantially similar to the controller disclosed in relation to the method 100 and/or the method 200, discussed supra. The method 300 may be applicable to all Chemical Vapor Deposition (CVD) processes that utilize a substrate support. The method 300 enables the dynamic and real-time control of the processing spacing, and further allows for multiple dimensional degrees of freedom to change the angle and spacing of the substrate plane with respect to the gas distribution member at any time during the deposition process.

At operation 310, a layer is deposited on a substrate disposed on the substrate support. The layer may be a thin film coating formed as the result of a reaction between the various gaseous phases and the heated surface of the substrate within the CVD processing chamber. At operation 320, a thickness of the layer disposed on the substrate is measured. The thickness of the layer may be measured at one location or at a plurality of locations on the substrate. The substrate support may include a plurality of measurement locations to measure the spacing between the substrate or substrate support and the gas distribution member. In some implementations, the each measurement location may comprise a measurement device mounted thereon. The number and proximity of the measurement locations may vary.

At operation 330, a difference in thickness is calculated between a reference location on the substrate and a plurality of remaining locations on the substrate. The reference location may be predetermined or selected in real time. Any point may be selected as the reference location and the thickness differences are calculated between the reference location and the remaining locations. The thickness difference between the reference location and each of the remaining locations is divided by the deposition time to obtain the deposition rate differentials between the reference location and the remaining locations.

At operation 340, processing spacing adjustment amounts are determined for the plurality of remaining locations relative to the reference location. The processing spacing adjustment amounts are determined based on the differences in thickness between the reference location and the plurality of remaining locations. In some implementations, the determining includes multiplying, the differences in thickness between the reference location and each of the plurality of remaining locations divided by a deposition time for forming the layer on the substrate, by a correlation factor previously determined to provide improved thickness uniformity for the layer. The correlation factor is proportional to a ratio of the change in spacing divided by a deposition thickness rate of the layer. The change in spacing may be the difference in space between the gas distribution member and the substrate support or each remaining location.

At operation 350, the substrate support is dynamically adjusted in real time at a first mounting location coupled to the substrate support to reduce the differences in thickness between the reference location and each of the plurality of remaining locations. In certain implementations, the substrate support may be coupled to one or more adjustment members. Moreover, in some embodiments, the one or more adjustment members may be coupled to the substrate support at a one or more mounting locations distributed over the substrate support. The adjustment members are independently adjustable to change the spacing between the substrate support and the gas distribution plate at the mounting locations. As such, an alteration of the spacing between the substrate support and the gas distribution plate at a plurality of corresponding mounting locations, thus adjusting the tilt of the substrate support with respect to the gas distribution member. In some embodiments, the one or more mounting locations may be uniformly distributed around the substrate support with respect to a center of the substrate support. Furthermore, the one or more mounting locations may be disposed on a bottom side of the substrate support. In some implementations, at least three mounting locations may be utilized, each mounting location having an adjustment member operatively coupled thereto.

At operation 360, the substrate support is dynamically adjusted in real time at a second mounting location coupled to the substrate support to reduce the differences in thickness between the reference location and each of the plurality of remaining locations. At each of operation 350 and operation 360, the dynamic adjusting occurs during the depositing. In certain embodiments, the method 300 may further include repeating each of operation 310, operation 320, operation 330, operation 340, and operation 350 until the depositing is complete. Each dynamic adjustment may include one of leveling, tilting, swiveling, or wobbling of the substrate support or the substrate during a deposition process.

In certain implementations, the dynamic adjusting of the substrate support at the first mounting location and the dynamic adjusting of the substrate support at the second mounting location occur concurrently, while in other implementations the each may occur at different times, and/or begin at separate times. Furthermore, the dynamic adjusting of the substrate support at the first mounting location and at the second mounting location occurs during a chemical vapor deposition process, and in real time to reduce a difference in deposition non-uniformities.

Moreover, in certain implementations, the method 300 may further include dynamically adjusting the substrate support at a third mounting location coupled to the substrate support, wherein the dynamic adjusting of the substrate support at the third mounting location occurs during the chemical vapor deposition process and in real time to reduce a difference in deposition non-uniformities. In implementations including the dynamic adjusting of the substrate support at the third mounting location, each of the dynamic adjusting of the substrate support at the first mounting location, the second mounting location, and the third mounting location may occur concurrently, or, in some implementations, each may begin at different, and/or each may occur at separate times.

In certain implementations, the dynamic substrate leveling, tilting, swiveling, or wobbling is achieved by automating the vertical adjustment at one or more of the mounting locations, as discussed supra. In some implementations, the vertical adjustment of at least two mounting locations operatively connected to the substrate support may be had while maintaining the third mounting locations fixed may level, tilt, swivel, or wobble the substrate support.

Figure 4A:
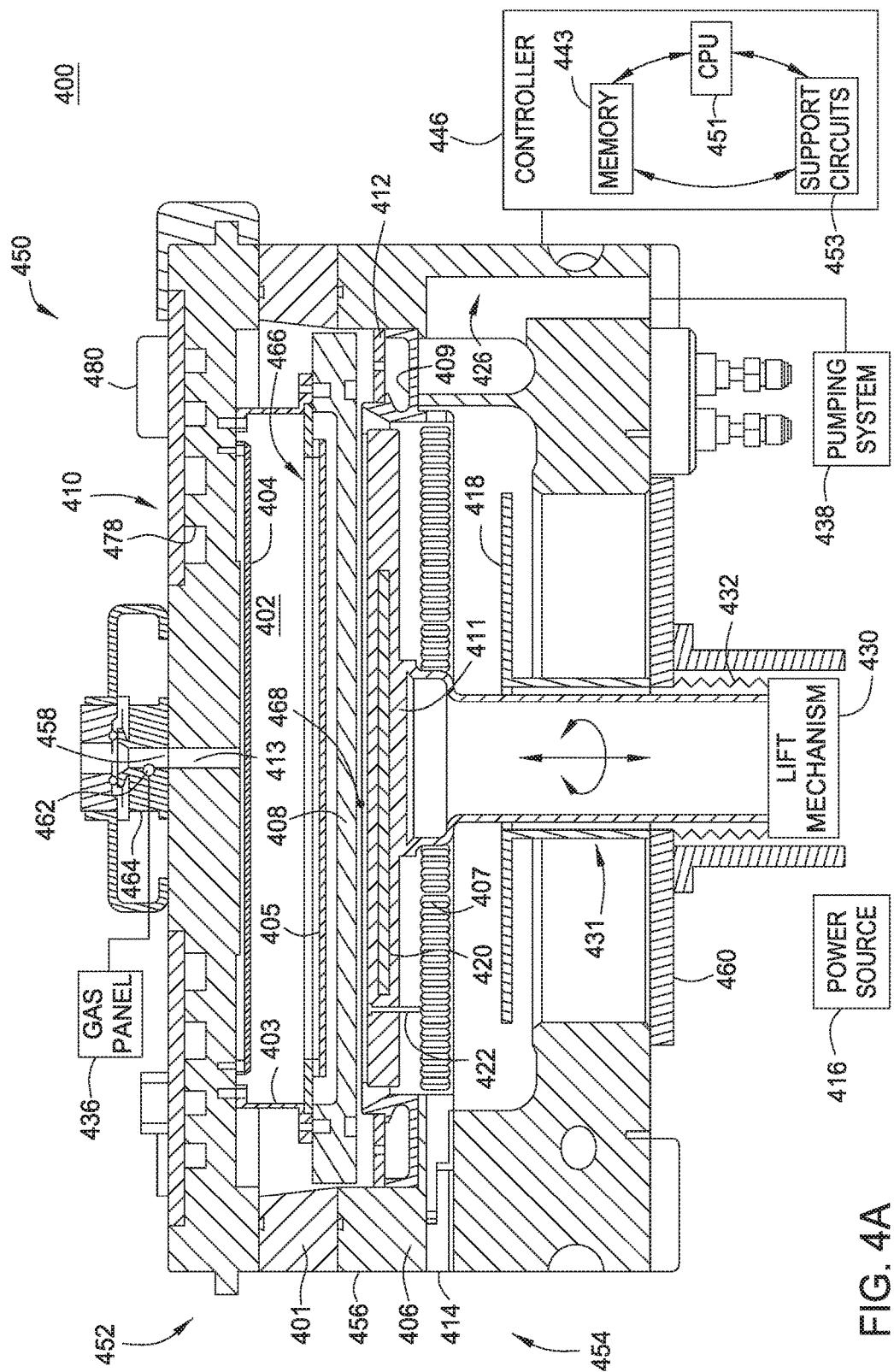
FIG. 4A schematically illustrates a cross-sectional view of a processing chamber, according to implementations described herein.

FIG. 4A schematically illustrates a cross sectional view of an implementation of a single CVD reactor 400. In some implementations, and as depicted in FIG. 4A, the reactor 400 may include a processing chamber 450, a power source 416, a gas panel 436, a pumping system 438, and a controller 446.

The CVD reactor 400 and/or the processing chamber 450 disclosed herein, may be utilized to perform the method 100, the method 200, or the method 300 discussed supra.

The processing chamber 450 generally includes a bottom assembly 454, an upper assembly 452, and a pedestal lift assembly 431. The processing chamber 450 may contain additional apparatus, as described below, to control or alter the chamber environment.

The bottom assembly 454 comprises a chamber body 456 having a wall 406 partially defining an interior of the processing chamber 450. The wall 406 may be substantially cylindrical and closed at the upper end by a lid 410. Sections of the wall 406 may be thermally regulated. For example, in some embodiments, a plurality of conduits (not shown) may be disposed in the wall 406 and configured to circulate a heat transfer fluid to regulate temperature of the wall 406.

A substrate support 411 is disposed in the bottom assembly 454 for supporting a substrate during processing. The substrate support 411 may include a heater 420 configured to regulate the temperature of the substrate and/or temperature in a processing 468 volume of the processing chamber 450. The heater 420 is coupled to the power source 416 and, in some embodiments, may maintain the substrate at a temperature of up to about 800 degrees Celsius.

A slit valve opening 414 may be positioned in the wall 406 of the chamber body 456 to facilitate entry and egress of substrates into and out of the processing chamber 450.

The upper assembly 452 generally includes lid 410 and may further include gas feed inlets, a gas mixer, a remote plasma source, and one or more gas distribution members 466. The lid 410 may be moveably coupled to the bottom assembly 454. The lid 410 may further include one or more grooves or channels 478 for flowing a heat transfer fluid therethrough to help maintain the lid 410 at a desired temperature. In some implementations, a manifold 480 may be provided to route the heat transfer fluid to/from the channels 478.

The gas panel 436 provides process chemicals, in liquid and/or gaseous form, to the processing chamber 450. The gas panel 436 is coupled to the lid 410 using a plurality of gas lines. Each gas line may be adapted for transferring specific chemicals from the gas panel 436 to the inlet port 458, as well as be temperature controlled. In some embodiments, one or more gas feed inlets 462 may be provided in a lid manifold 464 coupled to an upper surface of the lid 410 to facilitate deliver of the process chemicals to the process chamber 450.

The lid manifold 464 generally provides process materials to the process chamber through the lid 410. In some embodiments, the lid 410 may include an inlet port 458 and a mixer 413. The mixer 413 may lead to a gas distribution member 466, such as a showerhead, for providing process materials to the interior of the processing chamber 450, such as the processing volume 468. The showerhead provides, through a plurality of openings, distribution of gases or vapors delivered from the gas panel 436.

For example, during processing, feed gas may enter the processing chamber 450 through a gas delivery system (e. g., gas panel 436 and associated apparatus) before passing through the inlet port 458 to mixer 413 in the lid 410 and holes (not shown) in a first blocker plate 404. The feed gas then travels through a mixing region 402 created between the first blocker plate 404 and a second blocker plate 405. The second blocker plate 405 is structurally supported by a faceplate extension 403. After the feed gas passes through holes in the second blocker plate 405, the feed gas flows through holes in a faceplate 408 and enters the main processing region defined by the chamber wall 406, the faceplate 408, and the substrate support 411. Optionally, the processing chamber 450 may include an insert 401 disposed between an upper surface of the chamber wall 406 and the lid 410 that is heated to provide heat to the faceplate extension 403 to heat a mixing region 402.

A pedestal lift assembly 431 is coupled to a base 460 of the processing chamber 450 and is further coupled to the substrate support 411. The pedestal lift assembly 431 may comprise a lift mechanism 430, a lift plate 418, and a set of lift pins 422. In operation, the pedestal lift assembly 431 controls the elevation of the substrate support 411 between a processing position and a lowered position from which the substrate may be transported, through the slit valve opening 414, into and out of the processing chamber 450. The substrate support 411 is coupled to the chamber body 456 using a flexible bellows 432 to maintain an airtight seal between the interior and exterior of the processing chamber 450.

A pumping system 438 generally includes a throttle valve and one or more pumps arranged to control the pressure in the internal volume of the processing chamber 450. Gases flowing out of the processing chamber 450 are routed through a pumping ring to enhance gas flow uniformity across the surface of the substrate. For example, exhaust gases may exit the chamber through an exhaust pumping plate 409, a pumping port 426 formed in the wall 406 and coupled to the exhaust pumping plate 409, and ultimately, through the pumping system 438. The exhaust pumping plate 409 is configured to control the flow of exhaust from the processing region of the chamber. The exhaust pumping plate 409 may include a skirt extending downward and having a plurality of holes 407 formed therethrough in a section thereof. The section of the skirt of the exhaust pumping plate 409 having holes 407, shown as a series of slit shaped holes, facilitates compensating for heat loss proximate the slit valve opening 414. In some embodiments, the exhaust pumping plate 409 may have an exhaust plate cover 412, which rests on top of the exhaust pumping plate 409.

Figure 4B:
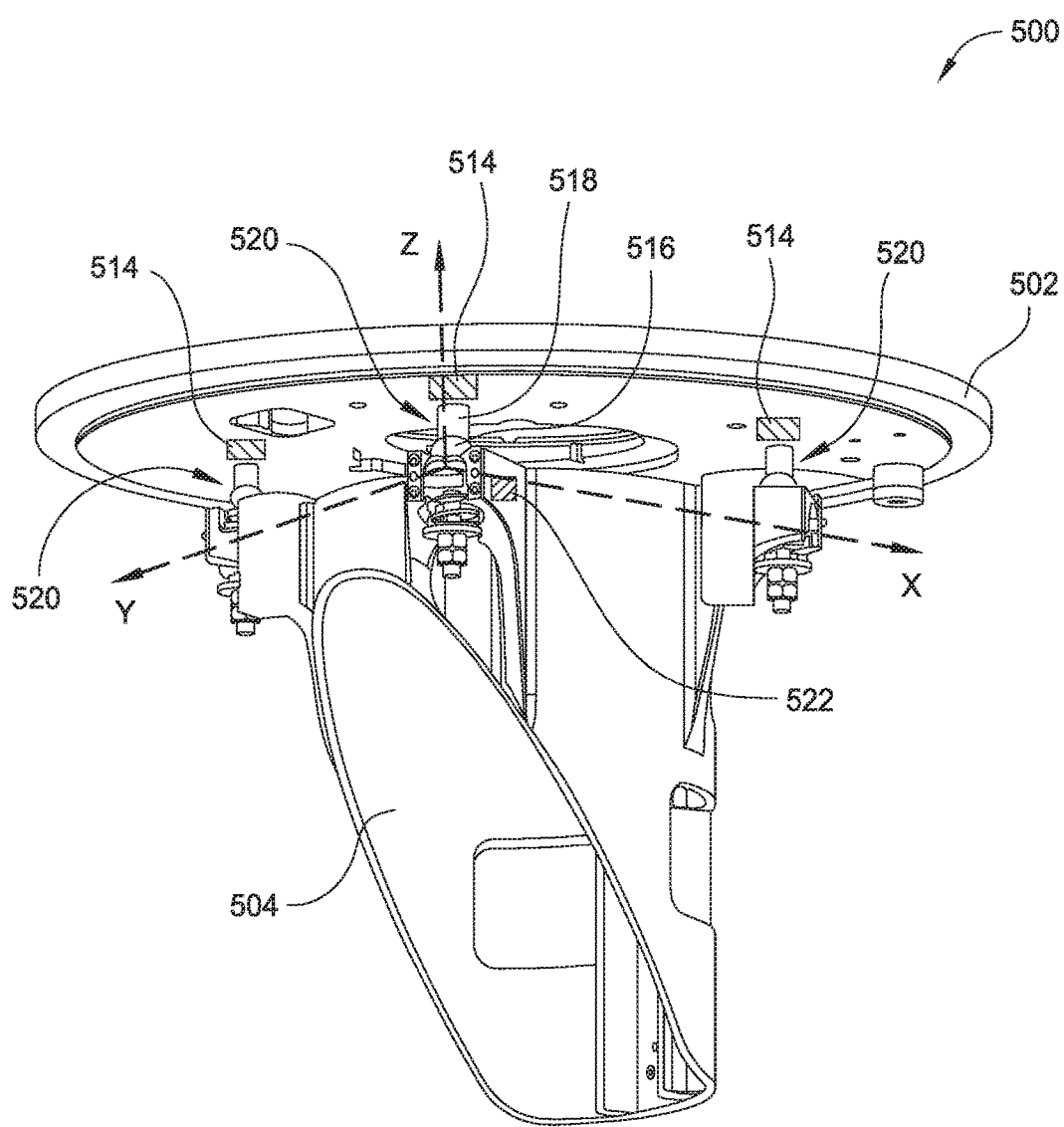
FIG. 4B schematically illustrates an apparatus for use in conjunction with the processing chamber of FIG. 4A, according to implementations described herein.

FIG. 4B schematically illustrates an apparatus 500 for dynamically adjusting the substrate support disposed in the processing chamber 450, as shown in FIG. 4A, for performing the methods disclosed herein. As shown in FIG. 4A, the substrate support 411 is disposed in the processing chamber 450 adjacent a gas distribution member 466, such that a processing volume 468 is formed therebetween. As shown in FIG. 4B, a support 504 may surrounds the pedestal lift assembly 431. The support 504 is coupled to a mounting plate 502 which may be coupled to the substrate support 411. The mounting plate 502 may include a supporting bracket 514 for coupling at least one adjustment member 518 at a mounting location 520 on the mounting plate 502. In some embodiments, the mounting plate 502 may include three mounting locations 520, each having an adjustment member 518 coupled thereto.

Each adjustment member 518 may extend and/or contract to adjust the length of the adjustment member 518, thus creating a level, a tilt, a swivel, or a wobble. In some embodiments, a motor 522 may adjust the length of each adjustment member 518. The adjustment member 518 has a mating component 516 connected thereto. In some embodiments, the mating component 516 is a ball joint interface which extends from the adjustment member 518 and is connected to the support 504. The ball joint interface may be locked in some embodiments or at certain mounting locations 520. In some implementations, a first ball joint interface may be locked, while a second ball joint interface and/or a third ball joint interface are enabled for providing a vertical adjustment, a leveling, a tilting, a swiveling, or a wobbling of the substrate support about the ball joint locations. In some implementations, the vertical adjusting, the leveling, the tilting, the swiveling, or the wobbling may be automated via the use of a motor 522.

Returning to FIG. 4A, the processing chamber 450 may further include a controller 446. The controller 446 may facilitate the control and automation of the processing chamber 450, the mounting plate 502, the substrate support 411, and/or any components thereof. The controller 446 may be coupled to or in communication with one or more of the processing chamber 450, the substrate support 411, the pedestal lift assembly 431, the adjustment members 518, the mounting plate 502 and/or the gas distribution member 466, among other components. Furthermore, in some embodiments, the controller 446 may control and/or automate process spacing tuning. When provided with the substrate performance of a previous processing run, the controller 446 may receive feedback regarding said substrate performance and further determine a new plane to dynamically adjust, offset, level, swivel, tilt, wobble, and/or move the skew from the on substrate result. As such, the controller 446 may comprise further programming for a feedback loop based on previous process spacing and results achieved. In certain embodiments, the automated process may occur in real-time.

The controller 446 may include a central processing unit (CPU) 451, memory 443, and support circuits (or I/O) 453. The CPU 451 may be one of any form of computer processors that are used in industrial settings for controlling various processes and hardware (e.g., pattern generators, motors, and other hardware) and monitor the processes (e.g., processing time and substrate position or location). The memory 443 is connected to the CPU 451, and may be one or more of a readily available memory, such as random access memory (RAM), read only memory (ROM), floppy disk, hard disk, or any other form of digital storage, local or remote. Software instructions and data can be coded and stored within the memory 443 for instructing the CPU 451. The support circuits 453 are also connected to the CPU 451 for supporting the processor in a conventional manner. The support circuits 453 may include conventional cache, power supplies, clock circuits, input/output circuitry, subsystems, and the like. A program (or computer instructions) readable by the controller implements the method described herein and/or determines which tasks are performable on a substrate or substrate support. The program may be software readable by the controller and may include code to monitor and control, for example, the processing time and substrate position or location of the substrate support within the processing chamber.

By automating the adjustment of the specific mounting locations during deposition with vertical freedom in combination, the substrate support plane can sweep through any variation of spacing of the processing volume 468 about at least one adjustment member 518 and/or at least one mating component 516, such as a ball joint, and at least one mounting location 520.

Various other apparatus not shown may be utilized to level, tilt, swivel, shake, adjust, and/or wobble the substrate support or substrate, and may include a worm gear drive apparatus, which may include at least one threaded mounting stud operatively connected to a substrate support, a ball screw drive apparatus, or an air bearing device, among others.

Benefits of the present disclosure include the dynamic adjustment and changing of the process spacing within the processing volume disposed between a substrate support and a gas distribution member. Further benefits include leveling of the substrate support and/or the substrate during a deposition process on the fly to achieve a higher level of film deposition uniformity. Additionally, the independent leveling or tuning of each adjustment member is utilized to improve overall stack deposition performances.

Additional benefits include the modulation of the RF coupling via the dynamic adjustment of the process spacing among the conductance and/or flow from the gas distribution member. RF generating plasma is sensitive to the spacing between the electrodes (e.g., gas distribution member to pedestal). The ability of dynamically change the process spacing between recipes optimizes film deposition performance per each film to improve the overall performance of a stack film. Such dynamic adjustments made via leveling, swiveling, tilting, wobbling, and/or moving are utilized in conjunction with substrate chucking capable heaters to improve stability of the substrate upon processes requiring continuous substrate movement.

Furthermore, the dynamic adjusting may also be utilized in conjunction with substrate chucking capable heaters to improve stability of the substrate upon processes utilizing continuous substrate movement.

Testing was performed, and results indicate that the continuous variation of the substrate support plane with respect to a gas distribution member, such as a showerhead or electrode, during deposition allows for the averaging of the effective deposition on a substrate. The variation in the gap between the electrodes induces different deposition rates, and such control can selectively control deposition rate of a region or average out the entire substrate. Furthermore, in non-plasma coupling processes, results indicate that varying the gap between the showerhead induces different flow conductances, thus resulting in difference precursor residence times. Such control directly affects the deposition thickness of the film, thus enabling a control to further improve on the film thickness uniformity.

In summation, the implementations described herein generally relate to the dynamic, real-time control of the process spacing between a substrate support and a gas distribution medium during a deposition process. Multiple dimensional degrees of freedom are utilized to change the angle and spacing of the substrate plane with respect to the gas distributing medium at any time during the deposition process. As such, the substrate and/or substrate support may be leveled, tilted, swiveled, wobbled, and/or moved during the deposition process to achieve improved film uniformity. Furthermore, the independent tuning of each layer may be had due to continuous variations in the leveling of the substrate plane with respect to the showerhead to average effective deposition on the substrate, thus improving overall stack deposition performance.

While the foregoing is directed to implementations of the present disclosure, other and further implementations of the disclosure may be devised without departing from the basic scope thereof, and the scope thereof is determined by the claims that follow.

What is claimed is:

1. A method of controlling processing spacing between a gas distribution member and a substrate support disposed opposite the gas distribution member, comprising:
   (a) depositing a layer on a substrate disposed on the substrate support;
   (b) measuring a thickness of the layer on the substrate;
   (c) calculating differences in thickness between a reference location on the substrate and a plurality of remaining locations on the substrate;
   (d) determining processing spacing adjustment amounts for the plurality of remaining locations relative to the reference location based on the differences in thickness between the reference location and the plurality of remaining locations; and
   (e) dynamically adjusting the processing spacing in real time to reduce the differences in thickness between the reference location and each of the plurality of remaining locations, wherein the dynamically adjusting occurs during further depositing of the layer.

2. The method of claim 1, further comprising: (f) repeating (a)-(e) until the depositing is complete.

3. The method of claim 1, wherein the dynamically adjusting includes leveling, tilting, swiveling, or wobbling of the substrate support or the substrate during deposition.

4. The method of claim 1, wherein the dynamically adjusting comprises:
   continuously changing a plane of each of the plurality of remaining locations.

5. The method of claim 1, wherein the determining the processing spacing adjustment amounts comprises:
   determining a difference in thickness between the reference location and each of the plurality of remaining locations, divided by a deposition time for forming the layer on the substrate; and
   multiplying by a correlation factor previously determined to provide improved thickness uniformity for the layer.

6. The method of claim 5, wherein the correlation factor is proportional to a ratio of change in spacing divided by a deposition thickness rate of the layer.

7. The method of claim 1, wherein the dynamically adjusting further includes altering an angle and spacing of a plane of the substrate support with respect to the gas distribution member.

8. The method of claim 1, wherein the dynamically adjusting occurs at a plurality of pivot points.

9. A method of controlling processing spacing between a gas distribution member and a substrate support disposed opposite the gas distribution member, comprising:
   dynamically adjusting the substrate support at a first mounting location coupled to the substrate support; and
   dynamically adjusting the substrate support at a second mounting location coupled to the substrate support, wherein the dynamically adjusting of the substrate support at the first mounting location and at the second mounting location occurs during a chemical vapor deposition process and in real time to reduce a difference in deposition non-uniformities during further depositing.

10. The method of claim 9, wherein the dynamically adjusting the substrate support at the first mounting location and the dynamically adjusting the substrate support at the second mounting location occur concurrently.

11. The method of claim 9, wherein the dynamically adjusting of the substrate support at the first mounting location and the dynamically adjusting of the substrate support at the second mounting location each occur at different times.

12. The method of claim 9, further comprising:
   dynamically adjusting the substrate support at a third mounting location coupled to the substrate support, wherein the dynamically adjusting of the substrate support at the third mounting location occurs during the chemical vapor deposition process and in real time to reduce a difference in deposition non-uniformities.

13. The method of claim 12, wherein the dynamically adjusting of the substrate support at the first mounting location, the dynamically adjusting of the substrate support at the second mounting location, and the dynamically adjusting of the substrate support at the third mounting location occur concurrently.

14. The method of claim 12, wherein the dynamically adjusting of the substrate support at the first mounting location, the dynamically adjusting of the substrate support at the second mounting location, and the dynamically adjusting of the substrate support at the third mounting location each begin at different times.

15. The method of claim 12, wherein the dynamically adjusting of the substrate support at the first mounting location, the dynamically adjusting the substrate support at the second mounting location, and the dynamically adjusting of the substrate support at the third mounting location each occur at separate times.

16. The method of claim 9, further comprising repeating the dynamically adjusting of the substrate support at the first mounting location and at the second mounting location until the chemical vapor deposition process is complete.

17. A method of controlling processing spacing between a gas distribution member and a substrate support disposed opposite the gas distribution member, comprising:
   (a) depositing a layer on a substrate disposed on the substrate support;
   (b) measuring a thickness of the layer on the substrate;
   (c) calculating differences in thickness between a reference location on the substrate and a plurality of remaining locations on the substrate;
   (d) determining processing spacing adjustment amounts for the plurality of remaining locations relative to the reference location based on the differences in thickness between the reference location and the plurality of remaining locations;
   (e) dynamically adjusting the substrate support in real time at a first mounting location coupled to the substrate support to reduce the differences in thickness between the reference location and each of the plurality of remaining locations; and (f) dynamically adjusting the substrate support in real time at a second mounting location coupled to the substrate support to reduce the differences in thickness between the reference location and each of the plurality of remaining locations, wherein each dynamically adjusting occurs during further depositing.

18. The method of claim 17, further comprising:
(g) repeating (a)-(f) until the depositing is complete.

19. The method of claim 17, wherein each dynamically adjusting includes leveling, tilting, swiveling, or wobbling of the substrate support or the substrate during deposition.

20. The method of claim 17, wherein the dynamically adjusting of the substrate support at the first mounting location and the dynamically adjusting of the substrate support at the second mounting location each occur at separate times.

\* \* \* \* \*